United States Patent
Chen et al.

(10) Patent No.: US 12,555,756 B2
(45) Date of Patent: Feb. 17, 2026

(54) SYSTEM AND METHOD TO MEASURE ION PROPERTIES IN A PLASMA SYSTEM

(71) Applicant: Tokyo Electron Limited, Tokyo (JP)

(72) Inventors: Zhiying Chen, Austin, TX (US); Megan Carruth, Austin, TX (US); Joel Blakeney, Austin, TX (US); Shyam Sridhar, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 229 days.

(21) Appl. No.: 18/490,256

(22) Filed: Oct. 19, 2023

(65) Prior Publication Data

US 2025/0132138 A1    Apr. 24, 2025

(51) Int. Cl.
  *H01J 37/32* (2006.01)

(52) U.S. Cl.
  CPC ........... *H01J 37/32935* (2013.01); *H01J 2237/24564* (2013.01)

(58) Field of Classification Search
  None
  See application file for complete search history.

(56) References Cited

U.S. PATENT DOCUMENTS

| | | |
|---|---|---|
| 7,777,179 B2 | 8/2010 | Chen et al. |
| 7,875,859 B2 | 1/2011 | Chen et al. |
| 8,816,281 B2 | 8/2014 | Funk et al. |
| 8,847,159 B2 | 9/2014 | Chen et al. |
| 9,087,677 B2 | 7/2015 | Funk et al. |
| 11,264,212 B1 | 3/2022 | Chen et al. |
| 2008/0032427 A1 | 2/2008 | Lee et al. |
| 2009/0242790 A1* | 10/2009 | Chen ............... H01J 49/443 250/397 |
| 2012/0248322 A1* | 10/2012 | Funk ............... H05H 1/0081 250/374 |
| 2017/0076920 A1* | 3/2017 | Chen ............. H01J 37/32935 |

FOREIGN PATENT DOCUMENTS

JP   2004235090 A   8/2004

OTHER PUBLICATIONS

Gahan, D. et al., "Retarding field analyzer for ion energy distribution measurements at a radio-frequency biased electrode," American Institute of Physics, AIP Review of Scientific Instruments 79, 033502, Mar. 10, 2008, 10 pages.

(Continued)

*Primary Examiner* — Edwin C Gunberg
(74) *Attorney, Agent, or Firm* — Slater Matsil, LLP

(57) ABSTRACT

A detector for a plasma measurement system, where the detector includes an insulating substrate including a cavity; a conductive plate spanning an entrance to the cavity; a first aperture through the conductive plate; an iris diaphragm including movable blades around a second aperture, the second aperture being aligned to the first aperture; an ion current collector disposed in the cavity, the iris diaphragm being disposed between the ion current collector and the conductive plate; and a rotatable gear coupled to the movable blades of the iris diaphragm.

20 Claims, 7 Drawing Sheets

(56) References Cited

OTHER PUBLICATIONS

Kim, Chang-Koo et al., "Plasma molding over surface topography: Energy and angular distribution of ions extracted out of large holes," Journal of Applied Physics vol. 91, No. 5, Mar. 1, 2002, 10 pages.
Liu, J. et al., "Ion Bombardment in rf plasmas," Journal Appl. Phys. 68 (8), Oct. 15, 1990, American Institute of Physics, 19 pages.
Woodworth, J.R. et al., "Experimental and theoretical study of ion distributions near 300 μm tall steps on rt-biased wafers in high density plasmas," J. Vac. Sci. Technol. A 21(1), Jan./Feb. 2003, American Vacuum Society, 9 pages.
Woodworth, J.R. et al., "Ion distribution functions in inductively coupled radio frequency discharges in argon-chlorine mixtures," Journal of Vacuum Science & Technology A 15, 3015-3023, accepted Jul. 11, 1997, published Nov./Dec. 1997, 10 pages.

\* cited by examiner

SYSTEM AND METHOD TO MEASURE ION PROPERTIES IN A PLASMA SYSTEM

TECHNICAL FIELD

The present invention relates generally to plasma systems and methods, and, in particular embodiments, a system and method to measure ion properties in a plasma system.

BACKGROUND

An integrated circuit (IC) is fabricated by sequentially depositing and patterning layers of dielectric, conductive, and semiconductor materials over a substrate to form a network of electronic components (e.g., transistors, resistors, and capacitors) connected by metal lines, contacts, and vias in a monolithic structure. Plasma processing is used extensively in IC fabrication, where many process steps employ plasma techniques such as chemical dry etch (CDE), sputtering, and reactive ion etch (RIE). Every two years, a new technology node with double the component density is introduced to meet an insatiable demand for low cost electronics with higher speed and functionality. Density doubling beyond the 7 nm node is enabled by shrinking lateral features with 13.5 nm extreme ultraviolet (EUV) lithography and reducing footprint with three dimensional (3D) devices (e.g., complementary field-effect transistor (CFET) and vertical NAND (V-NAND)), a combination that leads to fabricating structures with high aspect ratios that requires special plasma processing such as high aspect ratio contact (HARC) etching.

A semiconductor IC fabrication flow often includes direct plasma process steps, where a substrate is held on a substrate holder in a plasma chamber and exposed to a glow discharge plasma in direct contact with a major surface of the substrate facing the plasma. The plasma, in a plasma processing system, is a partially ionized gaseous mixture sustained in a vacuum chamber (referred to as a plasma chamber) by electromagnetic (EM) fields coupled to the plasma using electrodes powered with EM sources of the system. Ionization of neutral gas particles releases bound electrons to create highly mobile negatively charged free electrons and more heavy and sluggish positively charged ions. The ions and free electrons being mobile, their densities naturally adjust to maintain charge-neutrality and a near-zero electric field in a bulk region of the plasma. However, a region of positive space charge and high electric field, known as the plasma sheath, is formed adjacent to a surface at the periphery of the plasma, for example, an inner wall of the chamber, a surface of the substrate holder, or the major surface of a substrate on the substrate holder. The high electric field and associated charge density of the sheath serve to balance, in steady state, a flux of negative charge and a flux of positive charge from the bulk plasma to the surface to maintain charge conservation at an electrically floating surface. Initially, a rapid out-diffusion of electrons (relative to that of ions) from the plasma to the surface occurs because of the higher mobility of the lighter electrons. The initial high flux of electrons causes a build-up of negative charge on the surface balanced by a positive space charge due to an excess of ions in the plasma. The charge separation results in an electric field normal to the surface that retards the flux of negative charge (electrons) and accelerates the flux of positive charge (ions). This initial transient quickly settles to a steady state where a net electrical current to the surface equals zero, and a stable sheath is formed, where the electric field rises from a very low value in the bulk plasma to a very high value at the surface over a short distance of the order of a Debye length of the plasma. Generally, the major surface of the substrate that faces the plasma is facing the plasma sheath. The substrate is processed by modifying its exposed surface with neutral radicals diffusing through the sheath to the surface and positively charged ions impinging on the surface after being accelerated by the sheath electric field.

In general, properties of anisotropic plasma processes, such as sidewall profile, etch selectivity, etch rate, nonuniformity of etch rate (e.g., loading effects), and residue control are affected not only by the distribution of ion energy but also by its directionality characterized by an ion angle. Plasma processing used for fabricating high aspect ratio structures may be particularly sensitive to a joint distribution function of energy and angle of ions in an ion flux incident on the substrate being processed. Ion angle is the angle formed by the ion trajectory and a line normal to a major surface exposed to plasma for processing. A HARC etch process, for example, may benefit from a very narrow ion angle distribution around zero degree (vertical ion trajectory) to form via holes having an aspect ratio of about 50 or higher (e.g., 20 nm in diameter and about a micron or more deep). Accordingly, HARC etching relies on the plasma system to provide the ion flux with a tight distribution in the angle and energy of the ions incident on the major surface of the substrate in order to meet the stringent precision and control needed in IC manufacturing. The significance of ion energy distribution function and ion angle distribution function (IEDF and IADF) of ions to plasma processing underscores the importance of accurately measuring the joint distribution function of angle and energy of ions in the ion flux from the plasma in the plasma chamber of the plasma processing system. Thus, further innovations in plasma measurement systems and methods for precise measurement of ion properties are desired.

SUMMARY

A detector for a plasma measurement system, where the detector includes an insulating substrate including a cavity; a conductive plate spanning an entrance to the cavity; a first aperture through the conductive plate; an iris diaphragm including movable blades around a second aperture, the second aperture being aligned to the first aperture; an ion current collector disposed in the cavity, the iris diaphragm being disposed between the ion current collector and the conductive plate; and a rotatable gear coupled to the movable blades of the iris diaphragm.

A plasma measurement system for a plasma processing system, where the plasma measurement system includes a detector including: a conductive plate spanning an entrance to a cavity in an insulating substrate, the conductive plate including a first aperture; an iris diaphragm configured to have a variable second aperture, the second aperture aligned to the first aperture; an ion current collector disposed in the cavity, the iris diaphragm disposed between the ion current collector and conductive plate; and a rotatable gear coupled to the iris diaphragm and configured to vary a dimension of the second aperture; electrical equipment configured to be coupled to the detector, the equipment including: a bias signal generator configured to bias the ion current collector; and an ion current sense and analysis circuit configured to provide a signal representative of a joint distribution function of angle and energy of ions based on ion currents from the ion current collector, and a rotary drive mechanically coupled to the rotatable gear; and a controller configured to send signals including measurement conditions to the rotary drive and the electrical equipment.

A method of measuring a plasma in a plasma chamber of a plasma processing system, where the method includes positioning a detector over a substrate holder in the plasma chamber; generating the plasma directly above the detector in the plasma chamber; configuring the detector sequentially through a set of measurement conditions, the configuring including changing, for each set of the measurement conditions, an aperture of an iris diaphragm in the detector; sensing an ion current at an ion current collector aligned to the iris diaphragm in the detector for each set of the measurement conditions; and based on the sensed ion currents and measurement conditions, determining a joint distribution function of angle and energy of ions in an ion flux from the plasma.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
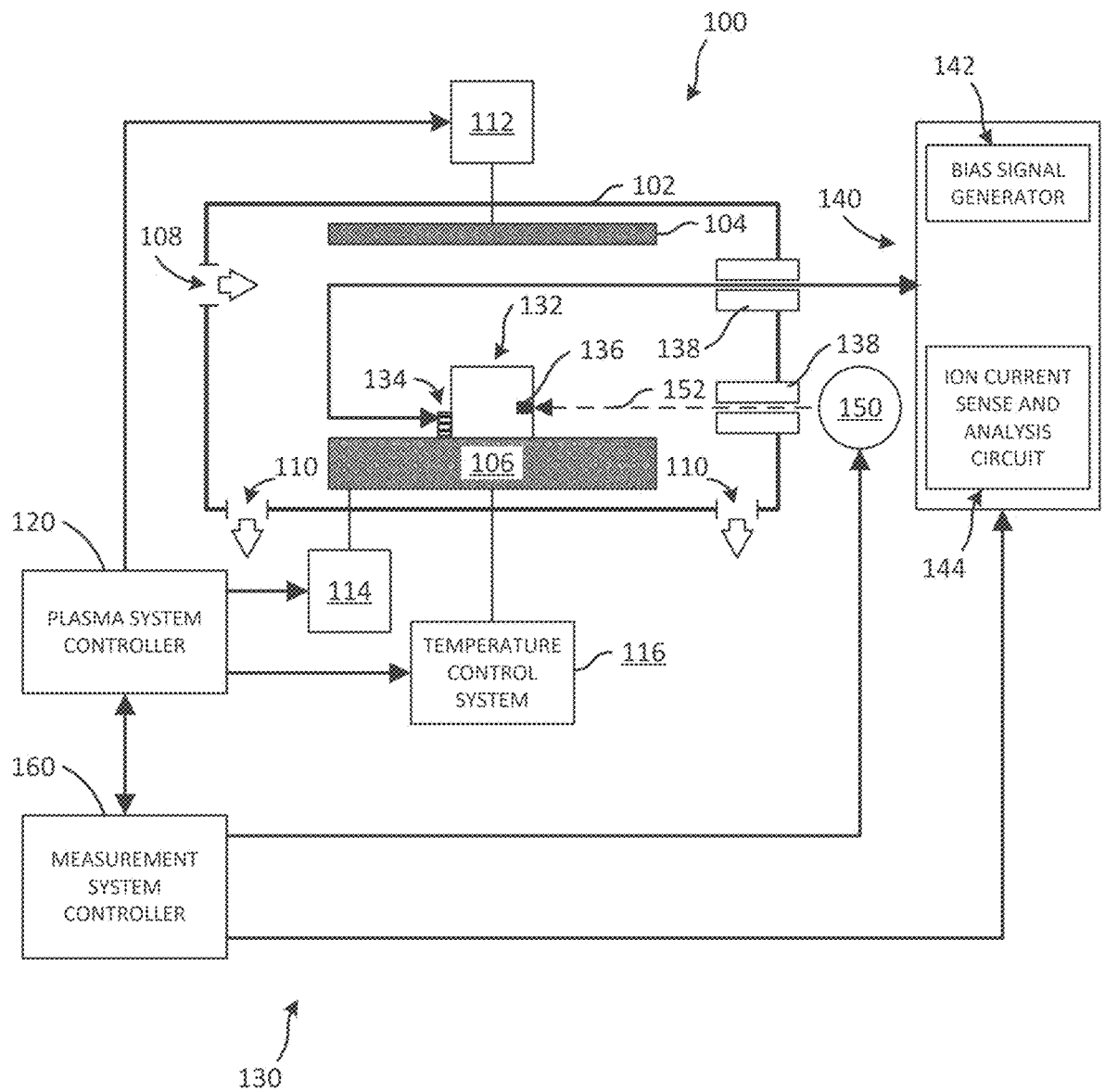
FIG. 1 illustrates a schematic cross-sectional view of a plasma processing system equipped with a plasma measurement system comprising a detector in a plasma chamber of the plasma processing system, in accordance with an embodiment of the invention.

This disclosure describes embodiments of an invention related to measurements that represent a joint distribution function of angle and energy of ions in an ion flux from a plasma in a plasma chamber of a plasma processing system. The ion flux is representative of an ion flux that may be used to modify a major surface of the substrate during direct plasma processing. In this disclosure, ion angle of an ion incident on a surface exposed to plasma refers to the angle formed by a trajectory of the ion and a line normal to the surface, and ion energy of the ion refers to a kinetic energy with which it strikes the surface.

The invention includes a detector that provides a measurement of ion current that represents a portion of the ion flux incident on a surface of the detector from the plasma when the surface is exposed directly to the plasma. The portion of the flux represented by the detected ion current include ions having ion energy and ion angle within a specific range and exclude ions outside the range. The range is specified by configuring the detector to a respective measurement condition. Since each measurement condition specifies a range of ion angle and ion energy, the respective detector configuration has to ensure that a sample of ions representative of the ions arriving with an ion energy and an ion angle within the specified range is selected for the ion current measurement.

The specified range of ion angles is selected by selecting a size of an adjustable aperture at a center of an iris diaphragm included in the embodiments of the invented detector. The angle selection technique for an example measurement system is described in further detail below in this disclosure. While the specified range of ion angles is selected by a mechanical adjustment of an aperture size, the specified range of ion energies may be selected by adjusting an electrical bias that adjusts an electric field acting on the ions inside the detector. An example of using electrical bias to select the ion energy range for the example embodiment is described in further detail below. The energy selection method used for the detector in this disclosure may be similar to those used for the detectors described in U.S. Pat. No. 11,264,212 (incorporated herein by reference).

In addition to embodiments of the detector, the disclosure describes embodiments of a plasma measurement system and a method for measuring the joint distribution function of angle and energy of ions in the ion flux from the plasma in the plasma chamber of the plasma processing system to the detector of the plasma measurement system.

The plasma measurement system includes the detector and additional equipment to set the detector to a measurement condition as well as to sense and analyze a set of measurements received from the detector using a respective set of measurement conditions selected by a controller of the measurement system that controls the operation of the equipment. During operation, the detector is inside the plasma chamber exposed to the plasma, and the equipment may be coupled to the detector from outside the chamber.

The measurement is done by first positioning the detector on a substrate holder in the chamber, and then generating a glow discharge plasma. The positioning of the detector in the plasma chamber places a surface of the detector in direct contact with the plasma. As explained in the background section, there is a steady state ion flux from the plasma to the surface, through a plasma sheath formed adjacent to the surface exposed to plasma. The distribution function being measured is that of the ions in this ion flux as they arrive at the surface of the detector. The set of measurements (mentioned above) is a set of responses from the detector as its configuration is stepped sequentially through each measurement condition of the set of measurement conditions selected by the controller. When configured to a specific measurement condition, the detector provides an ion current that represents an arrival rate of the ions, which are within the respective range of ion angle and ion energy specified by the measurement condition. Each of the ion currents is transmitted from the detector inside the chamber to an ion current sense and analysis circuit outside, where it is sensed and stored in a digital memory along with the respective measurement condition. The joint distribution function of angle and energy of ions may be computed by a processor of the sense and analysis circuit based on a set of stored data comprising the set measurements of ion currents and the respective set of measurement conditions.

In this disclosure, we first refer to a schematic cross-sectional view illustrated in FIG. 1 to describe an example of the plasma processing system 100 equipped with the plasma measurement system 130 comprising the detector 132 in the plasma chamber 102 of the plasma processing system 100. The structure of an example of the detector 132 is then described with reference to FIGS. 2A-2E. Additional equipment of the measurement system 130 are described with reference to schematics illustrated in FIGS. 3-4 and a method for operating the measurement system 130 to measure the joint distribution function of angle and energy of ions in the ion flux from the plasma in the plasma chamber 102 is summarized in a flow chart in FIG. 5.

The example plasma processing system 100 illustrated in FIG. 1 comprises the plasma chamber 102 configured as a capacitively coupled plasma (CCP) chamber. This is not intended to be construed as limiting the invention. In other embodiments, the plasma chamber 102 may be configured as an inductively coupled plasma (ICP) chamber, a microwave chamber, etc. In the CCP configuration, the plasma is sustained with EM power capacitively coupled to the plasma from, for example, disc-shaped electrodes in the plasma chamber 102 powered with EM sources of the plasma processing system 100. As illustrated in FIG. 1, there are two such electrodes in the plasma chamber 102, a top electrode 104, in an upper portion of the plasma chamber 102, and a bottom electrode, integrated in a substrate holder 106 in a lower portion of the plasma chamber 102. The walls of the plasma chamber 102 may comprise a material resistant to damage from exposure to reactants such as fluorine and oxygen, for example, stainless steel and yttria-coated aluminum. Typically, the chamber walls are coupled to a reference potential, referred to as system ground.

The plasma chamber 102 may be coupled to a gas flow system of the plasma processing system 100 comprising, for example, gas canisters, vacuum pumps, flow lines, throttle valves, flow meters, flow controllers, pressure meters, and the like. In the example in FIG. 1, a gas inlet 107 in a sidewall of the plasma chamber 102 is shown coupling the plasma chamber 102 to the gas flow system, for example, a flow line of the gas flow system (not shown). In another embodiment, gas may be introduced into the plasma chamber 102 through a showerhead in a ceiling of the chamber 102. Gas outlets 108, seen in a bottomwall of the plasma chamber 102 in FIG. 1, may be coupled to a vacuum pump (not shown) of the gas flow system. During operation, a gaseous mixture may be introduced in an upper portion of the plasma chamber 102 and pumped out from a lower portion of the plasma chamber 102, along with any gaseous byproducts produced in an interaction with the surfaces exposed to the plasma. The gas flow system maintains a controlled gas flow and ambient pressure in the plasma chamber 102 during processing, in accordance with a process recipe. The process recipe specifies all the values of parameters needed to configure the plasma processing system 100 to execute a plasma process step.

During operation, various EM power sources may be coupled to the top electrode 104 and the bottom electrode in substrate holder 106, or be disabled, to provide power to ionize the gas in the plasma chamber 102 to ignite and sustain the plasma between the top electrode 104 and the substrate holder 106, in accordance with the process recipe. In the example plasma processing system 100 in FIG. 1, the top electrode 104 is coupled to a power circuit comprising an RF power source and an impedance matcher, referred to as source power circuit 112. The substrate holder 106 is coupled to another power circuit (referred to as bias power circuit 114) comprising a combination of an RF bias power source, an impedance matcher, and a DC or a pulsed DC bias power source. Generally, bias power is used to control the voltage drop in the plasma sheath above the substrate holder 106. This voltage drop is important, since the ion energy and angle distribution of the ions in the ion flux incident on the surface exposed to the plasma for processing depends on the voltage drop in the sheath.

The plasma processing system 100 may further include a temperature control system 116 to control a temperature of the substrate holder to a value specified by the process recipe. The temperature control system 116 may comprise equipment coupled to the substrate holder 106 for cooling and heating during processing, for example, pumps to circulate a liquid refrigerant through cooling channels integrated in the substrate holder 106, a gas line to flow inert gas from below along groves in a top surface of the substrate holder 106, and an electrical power source coupled to resistive heating elements placed inside the substrate holder 106.

The operation of the gas flow system, the source power circuit 112, the bias power circuit 114, and the temperature control system 116 may be synchronously controlled by a plasma system controller 120 to implement the process recipe during processing a substrate.

The measurement system 130 is included in the plasma processing system 100 in FIG. 1 to measure ion properties in the plasma generated with the process recipe. In this example, the measurements provide information about ion distribution as a function of ion angle and ion energy in the ion flux impinging on the surface exposed to plasma sustained in the plasma chamber 102 according to a specific process recipe such as the recipe for a plasma HARC etch process. Since HARC etching is very sensitive to this distribution, measuring the distribution of incident ions over a range of energy and a range of ion angles around zero degree (zero degree being a direction orthogonal toward the surface exposed to the ion flux) is important for development, characterization, and control of plasma HARC etch recipes.

The detector 132 is loaded in the plasma chamber 102, as illustrated schematically in FIG. 1. In FIG. 1, the detector 130 is positioned directly on the substrate holder 106 inside the plasma chamber 102. As mentioned in the background section, during direct plasma processing, the substrate is held on the substrate holder 106 with a major surface of the substrate facing the plasma. In the example embodiment in FIG. 1, instead of the substrate, a surface of the detector 132 is facing the plasma. In some other embodiment, a diagnostic substrate may be placed on the substrate holder 106 and the detector 132 may be placed over the substrate.

The detector 132 is coupled to other equipment of the measurement system 130 to configure the detector to a measurement condition as well as to transmit and store the respective detector response (the ion current mentioned above). In some embodiments, these equipment are disposed outside the plasma chamber 102. For example, as illustrated schematically in FIG. 1, the detector 132 is coupled electrically, via a set of electrodes 134 of the detector 132, and mechanically, via a rotatable gear 136 of the detector 132, to equipment disposed outside the plasma chamber 102 and accessed through vacuum feedthroughs 138 in the walls of the plasma chamber 102. The equipment outside the plasma chamber 102 may comprise electrical equipment 140, which includes a bias signal generator 142 and the ion current sense and analysis circuit 144 to sense, store, and analyze the ion currents transmitted from the detector 132. The bias signal generator 142 comprises voltage sensors and voltage sources to configure the detector 132 to the ion energy range of the measurement condition. Electrical couplers such as cables going through one of the vacuum feedthroughs 138 may be used to couple the electrodes 134 to the electrical equipment 140. The equipment outside the plasma chamber 102 also comprises a rotary drive 150 to configure the detector 132 to the ion angle range of the measurement condition by rotating the rotatable gear 136 to operate the iris diaphragm, as described below. A mechanical coupler 152 (indicated by a dashed arrow in FIG. 1) comprising, for example, a gear and shaft, universal joints, and knuckle joints may be used to couple the rotatable gear 136 to the rotary drive 150. In some embodiments, the rotary drive 150 may be a servo motor.

The electrical equipment 140 and the rotary drive 150 may be receiving information and control signals related to the measurement conditions and detector configuration from a measurement system controller 160. The measurement system controller 160 and the plasma system controller 120 together synchronize the generation and characterization of the plasma.

The structure of an example of the detector 132 is now described with reference to FIGS. 2A-2E.

Figure 2A:
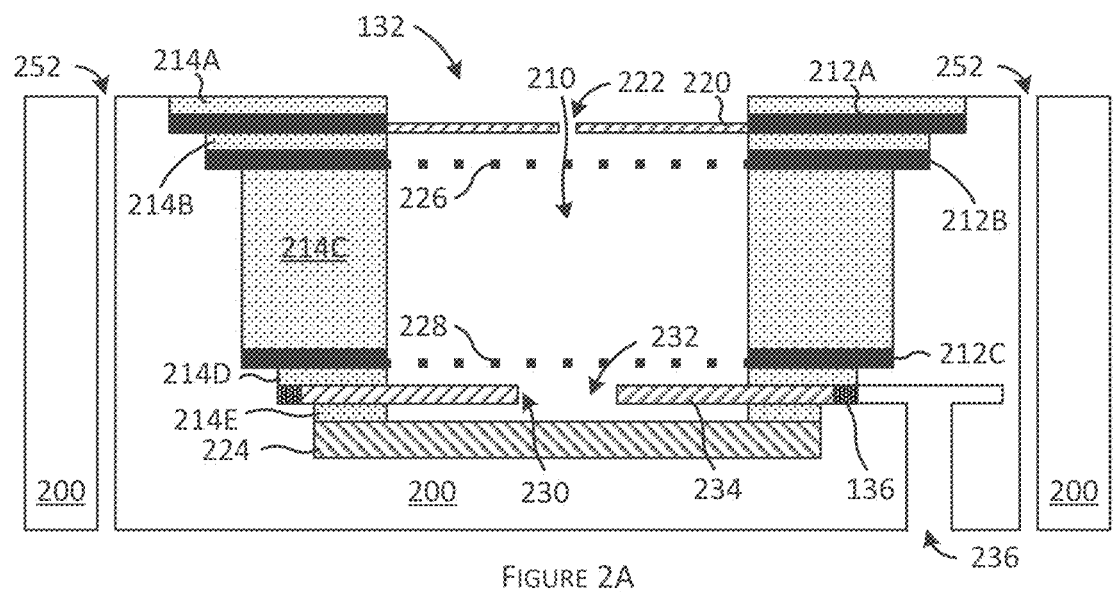
FIG. 2A illustrates a cross-sectional view of a detector, in accordance with an embodiment of the invention.
Figure 2B:
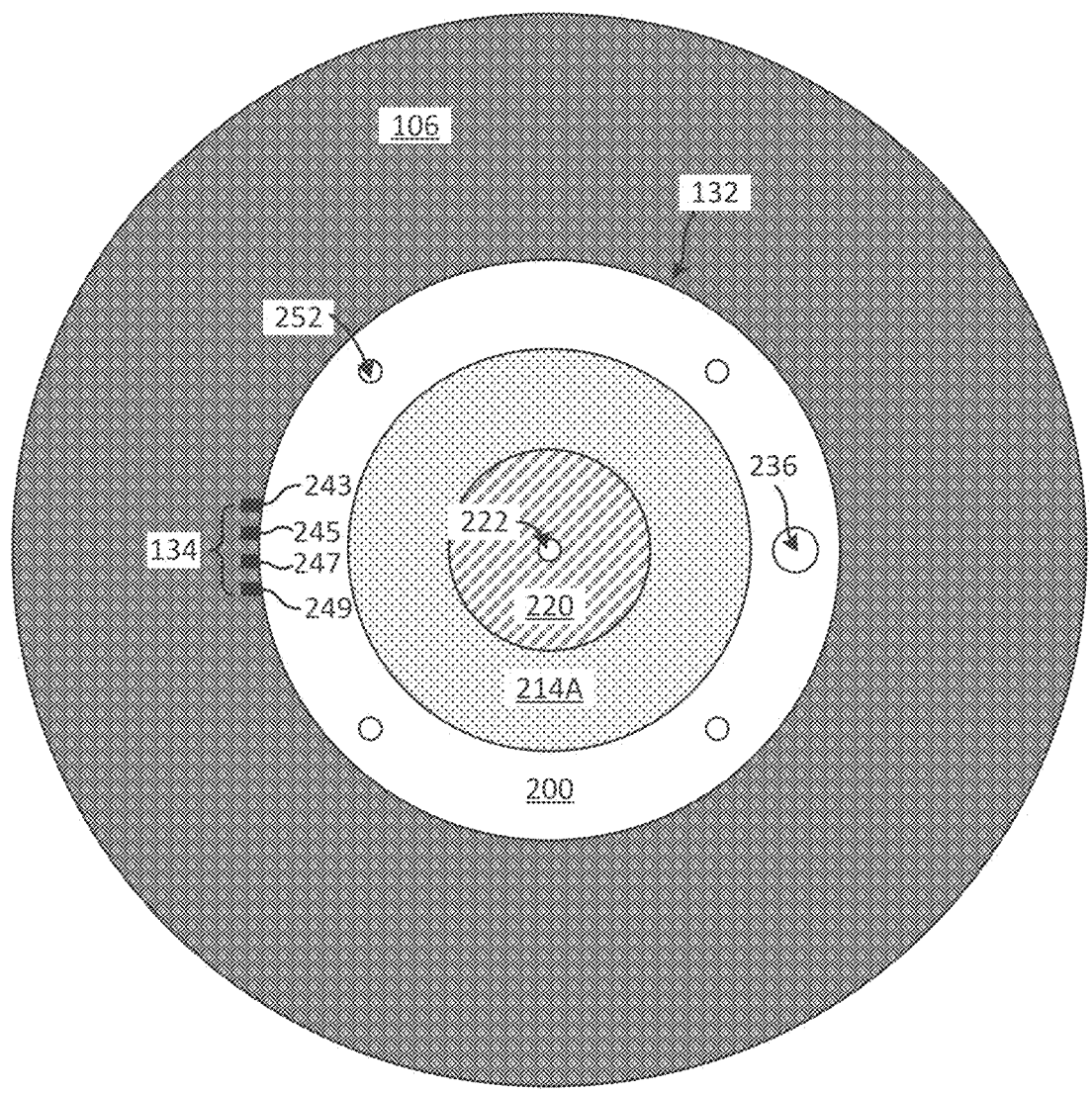
FIG. 2B illustrates a top view of the detector in FIG. 2A positioned over a substrate holder of the plasma chamber of the plasma processing system in FIG. 1.

FIG. 2A illustrates a cross-sectional view of the detector 132 and FIG. 2B illustrates a top planar view of the detector 132 in FIG. 2A positioned over the substrate holder 106.

As shown in the cross-sectional view in FIG. 2A, the detector 132 comprises an insulating substrate 200 having a cavity 210 that, on one side of the detector 132, is open to the ambient. When placed over the substrate holder 106 in the plasma chamber 102 (see FIG. 1 and FIG. 2B), the entrance to the cavity 210 opens upward, thus facing the plasma during measurement. Although, in FIGS. 1 and 2B, the detector 132 is positioned near the center of the substrate holder 106, it is understood that the detector 132 may be placed at another location to be exposed to the plasma, for example, near the edge of the substrate holder 106.

Inside the cavity 210, there may be several tiers of conductive rings, for example, a first conductive ring 212A, a second conductive ring 212B, and a third conductive ring 212C, as illustrated in FIG. 2A. The conductive rings 212A, 212B, and 212C are sandwiched between insulating rings (e.g., insulating rings 214A, 214B, 214C, and 214D in FIG. 2A) which provide electrical insulation as well as mechanical support. In some embodiment, the uppermost insulating ring 214A may be omitted. In the example embodiment, illustrated in FIGS. 2A-2B, the rings are arranged concentrically around a central axis of the cavity 210 forming a central opening shaped like a circular cylinder with vertical walls and an open end that faces the plasma during measurement. The circular cylindrical shape of the central opening is by example only and is not considered to be limiting.

Spanning an entrance to the cavity 210 is a disc-shaped conductive plate 220 connected (both physically and electrically) to the first conductive ring 212A. At the center of the conductive plate 220 is a first aperture 222 of a fixed size, which forms a passage through which particles may access the cavity 210. In this example embodiment, the first aperture 222 has a circular shape and the fixed size is a diameter of the circle, referred to as a first size. It is understood that other embodiments may use some other shape. When exposed to the plasma, a plasma sheath is formed adjacent to the conductive plate 220, as explained above. Particles, including positively charged ions and negatively charged electrons may enter the cavity 210 through the first aperture 222. The first size is about 0.1 mm in one embodiment, and may be from about 0.5 mm to about 0.2 mm in various embodiments. A diameter of the conductive plate 220 (which is also the diameter of the entrance) may be from about 10 mm to about 40 mm.

Another disc-shaped conductive plate disposed in the cavity at the end opposite the conductive plate 220 (at the bottom of the cavity 210 in FIG. 2A) is an ion current collector 224. The ion current collector 224 produces an electrical response to exposing the conductive plate 220 at the entrance of the cavity 210 to the plasma above inside the plasma chamber 102. Generally, a conductive plate, such as the ion current collector 224, biased at a fixed potential produces an electrical current given by a rate at which net charge is incident on the conductive plate. Here, the detector 132 is being used to detect a rate at which ions are incident on the ion current collector 224. To that purpose, the desired response is an electrical signal that provides a measurement of the rate at which the positively charged ions are arriving at the ion current collector 224, referred to as the ion current, in this disclosure. Thus, it is desirable that the negatively charged electrons do not contribute to the ion current. Typically, the electron density is much less than the ion density in the plasma sheath formed adjacent above the conductive plate 220 during operation. Nevertheless, the detector (e.g., the detector 132) may include a first conductive grid 226 to be biased, during measurement, as an electron rejection grid to repel electrons in the plasma sheath that may otherwise enter the cavity 210. The first conductive grid 226 is disposed within a short distance below the conductive plate 220 and attached to the second conductive ring 212B. Another potential source of electron flux inside the cavity 210 during the measurement is secondary electron emission from the ion current collector 224. In secondary electron emission, kinetic energy of the ions getting absorbed in the ion current collector 224 provide sufficient energy to the electrons there to escape to the cavity 210. Accordingly, the detector (e.g., the detector 132) may include a second conductive grid 228 to be biased, during measurement, as a secondary electron suppression grid to suppress the electrons in the ion current collector 224 that may otherwise be emitted out from a surface of the ion current collector 224 into the cavity 210. The second conductive grid 228 is disposed within a short distance above the ion current collector 224 and attached to the third conductive ring 212C.

Figure 2C:
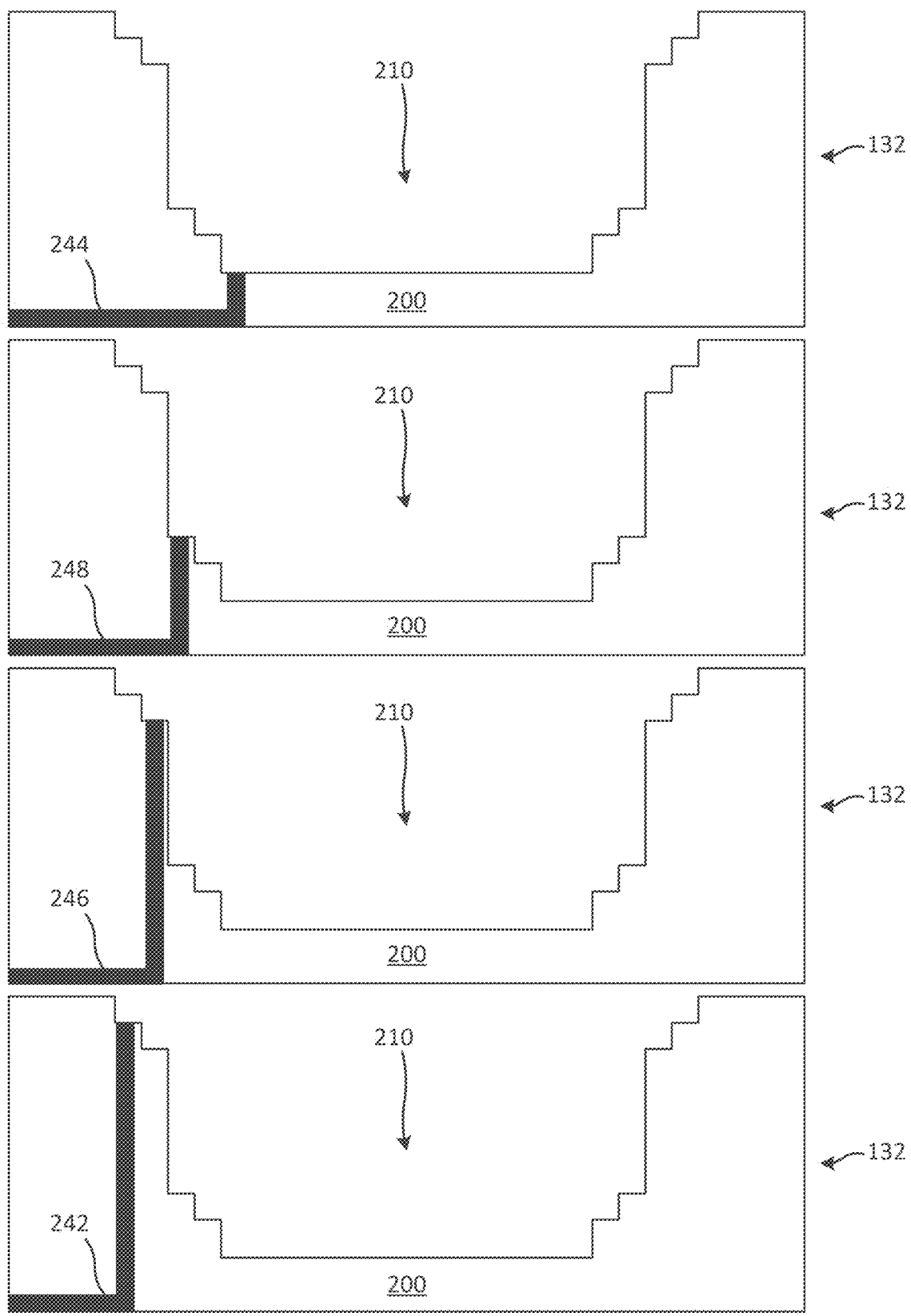
FIG. 2C illustrates four simplified cross-sectional views that show four conductive channels embedded in the detector illustrated in FIG. 2A.

FIG. 2C illustrates four simplified cross-sectional views of the detector 132 that show conductive channels 242, 244, 246, and 248 embedded in the insulating substrate 200 of the detector 132. As seen in FIG. 2C, the four conductive channels 242, 244, 246, and 248 are extended through the insulating substrate to have access to a side of the detector 132. Thus, the detector 132 may be configured to connect each of the channels 242, 244, 246, and 248 to a respective electrode in the set of electrodes 134 shown in FIG. 1 and in the top view in FIG. 2B. For example, channel 242 may be connected to a first electrode 243. Likewise, channels 244, 246, and 248 may be connected to a second electrode 245, a third electrode 247, and a fourth electrode 249, respectively.

By comparing the simplified cross-sectional views in FIG. 2C with the cross-sectional view of the detector 132 in FIG. 2A, it becomes apparent that the conductive channel 242 is coupled to the first conductive ring 212A, which is attached to the conductive plate 220. Thus, the conductive plate 220 may be accessed electrically via the first electrode 243. Likewise, the ion current collector 224 may be accessed electrically via the second electrode 245. The first conductive grid 226 and the second conductive grid 228 may be accessed via the third electrode 247 and the fourth electrode 248, respectively.

The conductive channels 242, 244, 246, and 248 embedded in the insulating substrate 200 of the detector 132 in this disclosure may be similar to those used for the detectors described in U.S. Pat. No. 11,264,212 (incorporated herein by reference).

Figure 2D:
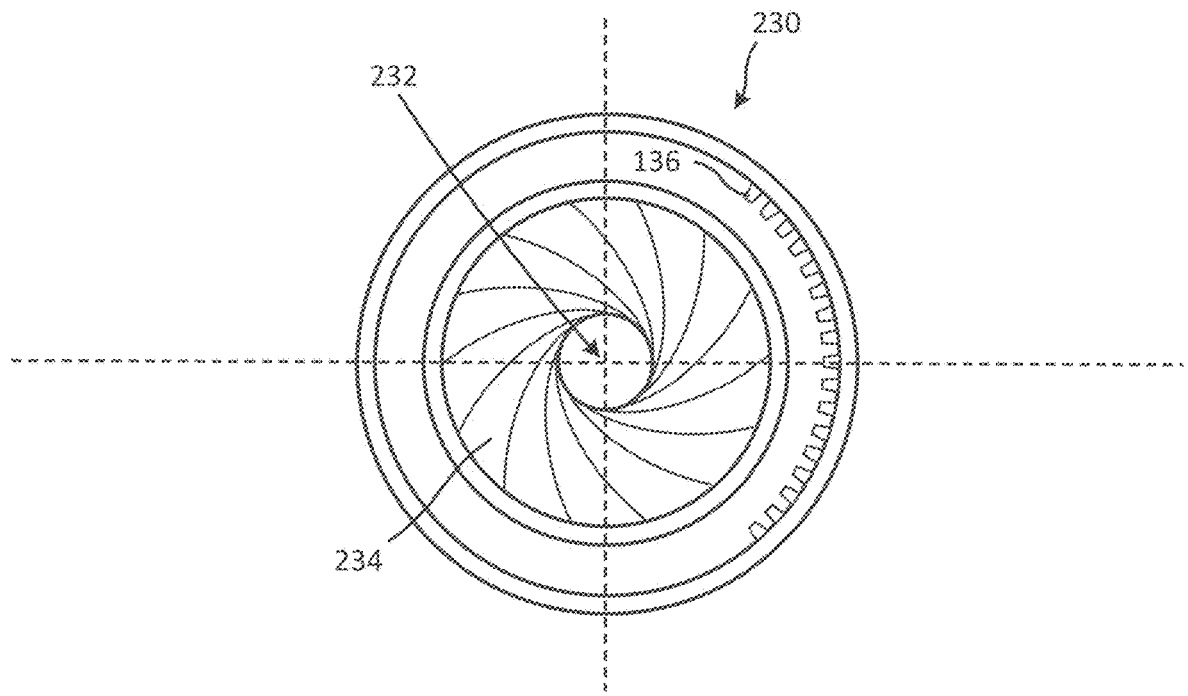
FIG. 2D illustrates a top view of an iris diaphragm, in accordance with an embodiment of the invention.

The detector 132 in FIG. 2A comprises the iris diaphragm 230 (mentioned above) around a second aperture 232. A top planar view of the iris diaphragm 230 is illustrated in FIG. 2D. While the second aperture 232 is transparent to ions, the iris diaphragm 230 comprises a material (e.g., a metal) that is opaque to ions. The second aperture 232 has an adjustable size, referred to as a second size, as opposed to the first size of the first aperture 222. As mentioned above, the range of ion angles for each measurement is selected by selecting the second size, i.e., the size of the second aperture 232. The second size may be selected by operating the iris diaphragm 230, which comprises movable blades 234 and the rotatable gear 136. The movable blades 234 are coupled to the rotatable gear 136. In the example embodiment illustrated in FIG. 2D, the number of movable blades is 14, which is high enough for the second aperture 232 to be well approximated by a circle. In various embodiments, the number of blades may be between about 10 to about 20 and the shape would be considered to be circular for data analysis. If the shape is circular then a diameter of the second aperture 232 may be considered to be the second size. However, it is understood that a fewer number of blades may be used and a modified analysis done for the respective shape, for example, a polygon shape. The second size may be adjusted by operating the iris diaphragm 230 to set the diameter of the second aperture 232 to be between a minimum value equal to the first size and a maximum value selected to cover a range of ion angles of interest. Typically, ion angles greater than 15° are not of interest since the number of ions moving along a trajectory directed far from the vertical in the high vertical field of the plasma sheath is negligibly small.

In various embodiments, the conductive plate 220, the first conductive grid 226, and the second conductive grid 228 comprise stainless steel, tungsten, molybdenum, or some other suitable metal of thickness about 0.5 mm to about 0.5 mm. The ion current collector 224 comprises a similar metal (e.g., stainless steel, tungsten, or molybdenum). In various embodiments, the iris diaphragm 230 may comprise parts that are conductive, insulating, or a combination of both. The conductive portion of the iris diaphragm 230 may comprise a metal, such as stainless steel, tungsten, or molybdenum, and may be coupled to the same potential as that of the second conductive grid 228. A thickness range for the iris diaphragm 230 and the ion current collector 224 may be from about 0.1 mm to about 1 mm.

Figure 2E:
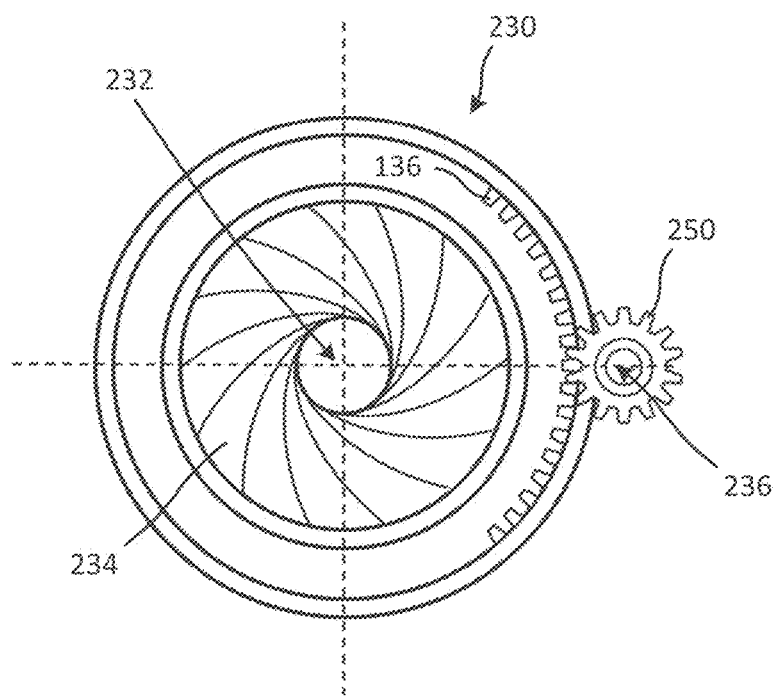
FIG. 2E illustrates a top view of the iris diaphragm illustrated in FIG. 2D, where a rotatable gear of the iris diaphragm is attached to a gear of a mechanical coupler, in accordance with an embodiment of the invention.

During measurement, the rotatable gear 136 may be rotated to configure the detector 132 to the ion angle range of the respective measurement condition. As explained with reference to FIG. 1, the measurement system 130 is equipped with the rotary drive 150 and the mechanical coupler 152, such as a gear and shaft, whereby, the iris diaphragm 230 may be operated with control signals from the measurement system controller 160 during a measurement. In FIGS. 2A-2B, the detector 132 has a passage 236 that may be used, for example, by a gear and shaft coupler. FIG. 2E shows an example of an external gear 250 of the mechanical coupler 152 coupled to the rotatable gear 136 of the detector 132. As indicated in FIG. 2E, a shaft (not shown) may be inserted at the center of the gear 250 via the passage 236.

Referring again to FIGS. 2A and 2B, the first aperture 222 and the second aperture 232 are aligned vertically. After alignment, the aligned structure may be secured by fasteners such as ceramic nuts and bolts positioned in the fastener-holes 252, illustrated in FIGS. 2A and 2B. When the conductive plate 220 is exposed to the plasma sheath, ions moving toward the substrate holder 106 along various trajectories may enter the cavity 210 through the first aperture 222. The ion angles of the ions entering the cavity 210 are distributed randomly between 0° (vertical) and 90° (horizontal) with an ion angle distribution function (IADF) matching that of ions incident on the conductive plate 220. However, only the ions passing through the second aperture 232 reach the ion current collector 224 since the iris diaphragm 230 comprises a material that is opaque to ions. This implies that ions having ion angles between zero degree and a maximum ion angle, $A_{max}$, are collected at the ion current collector 224 and the ions in trajectories with a higher ion angle are blocked by the iris diaphragm 230. It is desirable to have the iris diaphragm 230 as close as possible to the ion current collector 224. In various embodiments, a space between the iris diaphragm 230 and the ion current collector 224 is about 0.1 mm to about 1 mm and 0.2 mm, in one embodiment.

Each measurement condition specifies an $A_{max}$ and the detector 132 is configured accordingly by adjusting the second size (i.e., the size of the second aperture 232) using the iris diaphragm 230. The maximum ion angle, $A_{max}$, is well approximated by the semi-vertical angle of a right circular cone having its base in the plane of a top surface of the ion current collector 224 and its vertical axis passing through the centers of the first aperture 222 and the second aperture 232. The angle, $A_{max}$, is determined from the dimensions of the frustum intercepted between the first aperture 222 and the second aperture 232, i.e., the first size, $d_1$, the second size, $d_2$, and a separation, h, between the centers of the first aperture 222 and the second aperture 232. For example, from the geometry of right circular cones, $A_{max} = \tan^{-1}[(d_2-d_1)/2h]$. As mentioned above, in the set of measurement conditions for characterizing the IADF of a plasma process, $A_{max}$ is varied from zero degree to an upper limit for ion angle, $A_{maxUL}$, in small steps by varying $d_2$ from $(d_2=d_1)$ to an upper limit for the second size, $d_{2UL}$, in small steps. Since, generally, the ion angles are tightly concentrated around 0°, there being a high electric field in the plasma sheath directed toward the conductive plate 220, a small step size for $A_{max}$ is desired, particularly for $A_{max}$ values close to zero degree. In some embodiment, the step size for $A_{max}$ may be as small as 0.2° and, in various embodiments, the step size may vary between 0.5° and 5° and $A_{maxUL}$ may be from about 10° to about 30°. The steps for $d_2$ may be calculated from the geometrical relation between $d_2$, $A_{max}$, and h. In various embodiments, the separation, h, may be from about 10 mm to about 50 mm. The minimum step size for varying $d_2$ may be from about 0.1 mm to about 1 mm. Thus, a servo motor may be used as the rotary drive 150 (shown schematically in FIG. 2A) to adjust $d_2$ with the high precision needed to provide to provide a fine angle resolution during measurement.

As mentioned above, in some embodiments, there are two conductive grids between the first aperture 222 and the second aperture 232 spanning the opening in the cavity 210. The first conductive grid 226 is disposed between the conductive plate 220 and the iris diaphragm 230, and the second conductive grid 228 is disposed between the first conductive grid 226 and the iris diaphragm 230. The ions entering the cavity 210 through the first aperture 222 have to pass through the grid openings of the first conductive grid 226 and the grid openings of the second conductive grid 228 before they even reach the plane of the iris diaphragm 230 and the second aperture 232. If an ion transiting from the first aperture 222 toward the second aperture 232 collides with any of the two conductive grids (i.e., the first conductive grid 226 or the second conductive grid 228) then it is unable to contribute to the ion current signal from the ion current collector 224, resulting in an undesired signal loss. The transparency of each of the two conductive grids to ions may be from about 50% to about 80%. Clearly, the transparency of a pair of conductive grids is reduced from the transparency of each grid of the pair of grids. So, in some embodiments, grid openings of the first conductive grid 226 may be aligned to grid openings of the second conductive grid 228 to minimize a loss of transparency. As known to persons skilled in the art, the fabrication, assembly, and alignment of multiple grid detectors may use various techniques such as micro-electromechanical systems (MEMS), laser drilling, electrical discharge machining (EDM), electron-beam machining, and the like. After alignment, the aligned structure may be secured by fasteners such as ceramic nuts and bolts positioned in the fastener-holes 252, illustrated in FIGS. 2A and 2B. In some embodiment, grid openings of the grids may not be aligned.

The insulating parts of the detector 132, for example, the insulating substrate 200 and the insulating rings 214A, 214B, 214C, and 214D in FIG. 2A comprise a ceramic material, quartz, polyimide, or a polyimide-based thermoplastic material (commonly known as vespel).

Figure 3A:
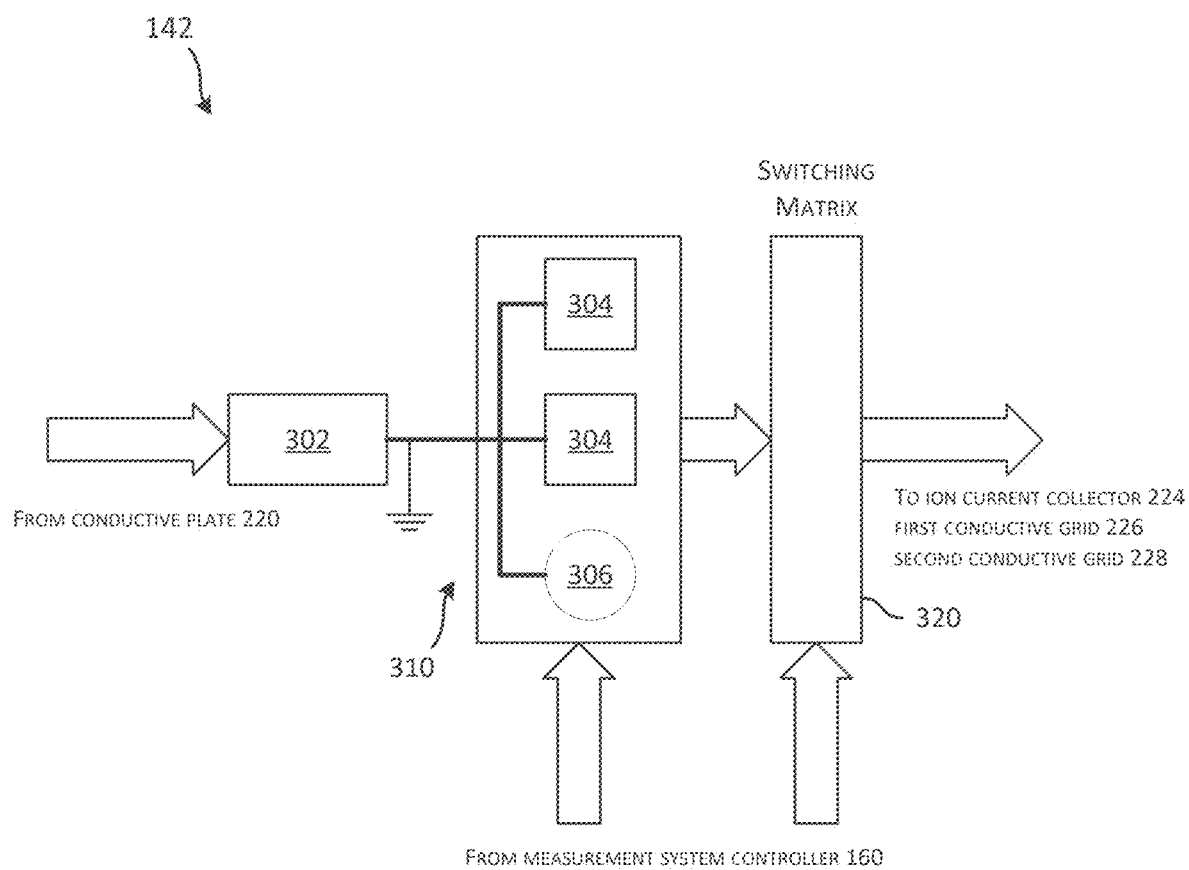
FIG. 3A illustrates a schematic of a bias signal generator, in accordance with an embodiment of the invention.

FIG. 3A illustrates a schematic of the bias signal generator 142 of the electrical equipment 140 of the measurement system 130, described above with reference to FIG. 1.

The example bias signal generator 142 is coupled to the conductive plate 220 via the vacuum feedthrough 138 and electrodes of the set of electrodes 134, as described above, and indicated by block arrows in FIG. 3A. A voltage sensor circuit 302 of the bias signal generator 142 coupled to may receive a signal from the conductive plate 220 of the detector 132 via the first electrode 243 (see FIGS. 2B and 2C). Being exposed to plasma, the conductive plate 220 acquires a self-bias potential. The signal received by the voltage sensor circuit 302 is represents the potential of the conductive plate 220. The voltage sensor circuit 302 senses the signal and outputs a voltage equal to the potential of the conductive plate 220, which is then applied as a reference voltage of the measurement system 130, as indicated by a ground symbol in FIG. 3A.

A bias source module 310 generates all the bias signals relative to the reference voltage of the measurement system. In order to generate all the bias signals that may be used to configure the detector 132 electrically, the bias source module 310 comprises variable voltage sources, for example, controllable DC voltage sources 304 and a controllable waveform generator 306. The bias signals are generated in the bias source module 310 and transmitted to the set of electrodes 134 of the detector 132, according to control signals received from the measurement system controller 160.

In some embodiments, the bias signal generator may include a switching matrix 320 controlled by the measurement system controller 160 to direct the various bias signals to appropriate electrodes of the set of electrodes 134 of the detector 132 that may be coupled, for example, to the ion current collector 224, the optional first conductive grid 226, and the optional second conductive grid 228. As explained in further detail below, a bias signal coupled to the ion current collector 224 via the second electrode 245 may be used to configure the detector 132 to select the range of ion energy specified in the measurement condition. In the example embodiments in this disclosure, for each measurement condition, the bias signal biases the ion current collector to a voltage (referred to as first voltage, $V_1$, in this disclosure) that sets, for example, a minimum value, $E_{min}$, of the respective range of ion energy. It is noted that, in these embodiments, there may be no maximum value, i.e., all the ions with an ion energy exceeding $E_{min}$ may be collected by the ion current collector 224.

As explained above, the measurement conditions are varied to scan through all the measurement conditions in the set of measurement conditions. Thus, between measurements, the value of $E_{min}$ may be varied by varying the first voltage coupled to the ion current collector 224. As mentioned above, the bias voltage coupled to the ion current collector 224 is the first voltage, $V_1$. Thus, for each value of $E_{min}$ there is a value of $V_1$ given by $V_1 = E_{min}/q$, where q is the charge of one ion. In other words, if the first voltage ($V_1$) is at zero volts (or negative) relative to the reference voltage then all the ions in the selected angle window (between 0° and $A_{max}$) may reach the ion current collector 224 (i.e., $E_{min} = 0$ eV). Now, if $V_1$ is varied to have a positive value then the ion current collector creates a barrier by repelling positively charged ions. Only the ions that overcome the barrier, having energies greater or equal to $E_{min}$, where $E_{min} = qV_1$, reach the ion current collector. All the ions having energies less than $E_{min}$ are excluded. For each value of the maximum angle, $A_{max}$, the values for $E_{min}$ may be varied by varying $V_1$ from 0 V to an upper limit $V_{1UL}$, which corresponds to an upper limit for ion energy, $E_{minUL}$, analogous to $A_{maxUL}$, the upper limit for the ion angle, explained above.

In some embodiments, the first voltage ($V_1$) may be changed in discrete steps or in a continuous ramp using, for example, the controllable DC voltage sources 304. In some embodiments, the first voltage may be changed with a waveform, for example, a triangular or a sawtooth waveform using, for example, the controllable waveform generator 306. The switching matrix 320 may be configured by the measurement system controller 160 to select the variable voltage source to be coupled to the second electrode 245 to bias the ion current collector 224 with the first voltage. It is noted that the output of the selected variable voltage source may not be directly connected to the second electrode 245 in order to insert a current sensing circuit 330, e.g., an ammeter, (shown in FIG. 3B) in the current path of the ion current. As explained below with reference to FIG. 3B, the second electrode 245 may be connected to an input port of the current sensing circuit 330 and the current sensing circuit 330 may be coupled to the selected variable voltage source via the switching matrix 320.

Each measurement condition is a pair of values comprising a value for $E_{min}$ and a value for $A_{max}$. The set of measurement conditions for characterizing the plasma process is all such pairs within a two-dimensional range defined by the range of ion energy, 0 eV to $E_{minUL}$, and the range of ion angle, 0° to $A_{maxUL}$.

Figure 3B:
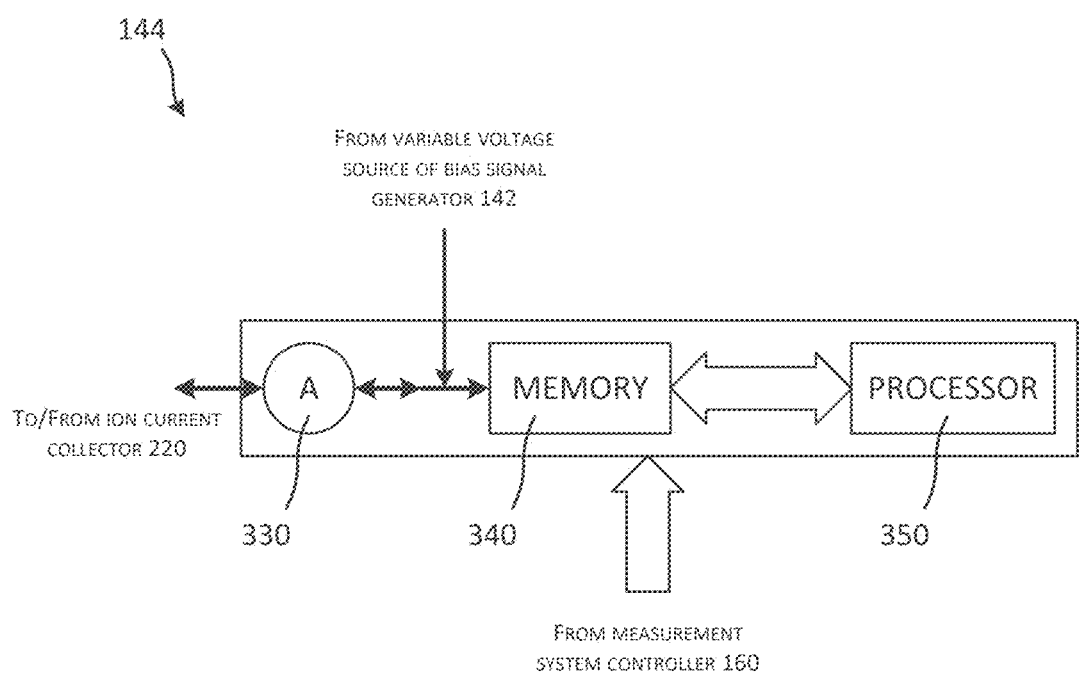
FIG. 3B illustrates a schematic of an ion current sense and analysis circuit, in accordance with an embodiment of the invention.

FIG. 3B illustrates a schematic of the ion current sense and analysis circuit 144 of the electrical equipment 140 of the measurement system 130, illustrated schematically in FIG. 1. The ion current sense and analysis circuit 144 is included in the electrical equipment 140 of the measurement system 130 to sense, store, and analyze the ion currents transmitted from the detector 132. The analysis provides a signal representative of a joint distribution function of angle and energy of ions based on the ion currents from the ion current collector 224.

The example ion current sense and analysis circuit 144 is coupled to the ion current collector 224 via the vacuum feedthrough 138 and the second electrode 245 of the set of electrodes 134. The current sensing circuit 330 of the ion current sense and analysis circuit 144 is configured to receive the ion current from the ion current collector 224. The current sensing circuit 330 may be a digital ammeter, i.e., it provides a digital signal representative of the ion current received from the ion current collector. The measurement data, being in digital form, may be stored in the digital memory 340 for subsequent analysis performed by the processor 350. Although FIG. 3B shows, e.g., a digital ammeter, the current sensing circuit 330 may comprise any ion current sensing circuit designed to make a precise measurement of current. For example, the current sensing circuit 330 may include an amplifier, such as a transresistance amplifier to produce a voltage signal representative of the ion current and an analog to digital (A/D) converter to convert the voltage signal to a digital signal.

In FIG. 3B, the current sensing circuit 330 is shown inserted in the current path between the ion current collector 224 and the variable voltage source used to generate the first voltage in the bias signal generator 142. During measurement, the ion current collector 224 is connected, at the same time, to two instruments of the electrical equipment 140, viz., the current sensing circuit 330 that receives the ion current and the variable voltage source in the bias source module 310 that biases the ion current collector 224 with the first voltage. In order to ensure that the measurement is executed correctly, the current sensing circuit 330 is inserted in the current path between the ion current collector 224 and the variable voltage source (in the bias signal generator 142 in FIG. 3A) coupled to the ion current collector 224.

In addition to the measurements of ion currents received from the current sensing circuit 330, the digital memory 340 receives the measurement condition for each ion current measurement from the measurement system controller 160 to another input port of the ion current sense and analysis circuit 144, as indicated in the schematic in FIG. 3B. The ion current sense and analysis circuit 144 has circuitry to tag the data to preserve a mapping between the measurement and the measurement condition. Both the measurement and the measurement condition are stored in a database in the digital memory 340. The digital memory 340 also stores a program comprising instructions to compute the joint distribution function of angle and energy of ions based on the stored measurements received from the current sensing circuit 330 and respective measurement conditions received from the measurement system controller 160. The measurement system controller 160 may signal the processor 350 to access the stored data and program in the memory 340 and execute the program to obtain the joint distribution function of angle and energy of ions based on the stored data. The processor 350 may store the resulting joint distribution function of ions in the digital memory 340, as indicated by the double arrow in FIG. 3B.

The invented method of measuring a joint distribution function of angle and energy of ions, described in this disclosure, relates to methods of characterizing ion properties of a direct plasma processes, where the plasma process being characterized produces the plasma to which the detector 132 is exposed. The response of the detector 132 to being exposed to plasma is the ion current output at the ion current collector 224 of the detector 132. The characterization comprises measuring the joint distribution function of angle and energy of ions in the ion flux from the plasma sheath to the conductive plate 220 of the detector 132 in the plasma chamber 102 by measuring a respective joint distribution function of angle and energy of ion currents. The ion angle is varied by using an iris diaphragm 230 to vary the diameter of the second aperture 232. The ion energy is varied by using one of the variable voltage sources in the bias signal generator 142 to vary the first voltage that is used to bias the ion current collector 224. The set of measured ion currents is stored and analyzed by the ion current sense and analysis circuit 144 to obtain the joint distribution function of ion angle and ion energy of the respective ion currents, from that distribution function of ion currents, obtain the joint distribution function of ion angle and ion energy of the ions in the ion flux to the conductive plate 220 of the detector 132.

Figure 4:
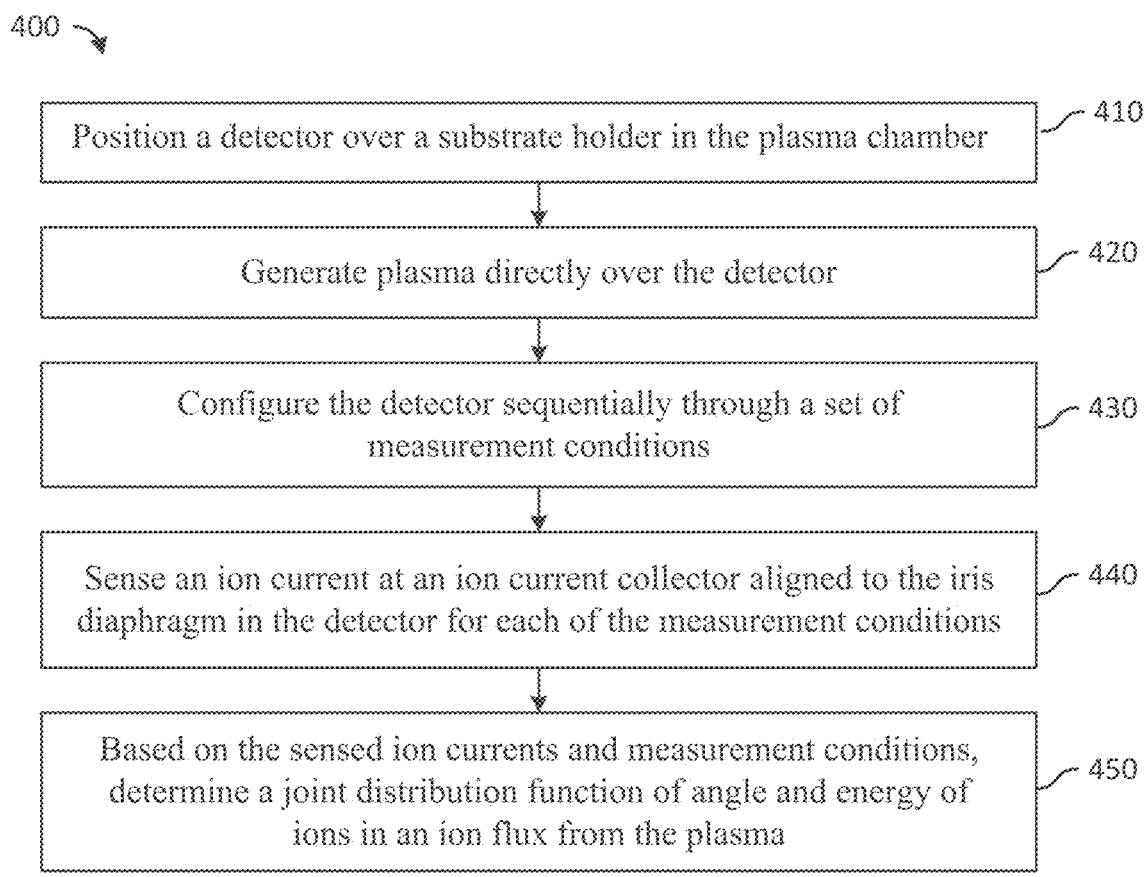
FIG. 4 illustrates a flowchart summarizing an example method of measuring a joint distribution function of angle and energy of ions, in accordance with an embodiment of the invention.

FIG. 4 illustrates a flowchart summarizing an example method 400 of measuring a joint distribution function of angle and energy of ions. The method summarized in FIG. 4 follows the measurement method outlined above.

As indicated in block 410 in the flowchart in FIG. 4, in the method 400, first, the detector 132 (see FIGS. 2A-2E) is positioned over the substrate holder 106 (see FIG. 1). As described above, the detector is positioned such that the top surface of the conductive plate 220 at the entrance of the cavity 210 and the first aperture 222 therein are exposed to the ambient, while the ion current collector 224 is at the opposite end over the floor of the cavity 210. As described above, between the ion current collector 224 and conductive plate 220 is the iris diaphragm 230 around the adjustable second aperture 232. For simplicity, the first conductive grid 226 and the second conductive grid 228 are not included in this example.

Next, as indicated in block 420 in the flowchart in FIG. 4, plasma is generated in the plasma chamber 102, as described above with reference to FIG. 1. The plasma is generated by powering electrodes (e.g., top electrode 104 and the substrate holder 106) coupled to the plasma chamber 102 while a discharge gas is flowing through the plasma chamber 102.

As indicated in block 430 in the flowchart of the method 400, the detector 132 is configured through each measurement condition of a set of measurement conditions. The set of measurement conditions is for characterizing the plasma process being used for the plasma to which the detector is exposed. For each measurement condition, the detector 132 is configured by adjusting the second size (the size of the second aperture 232) and by coupling the first voltage from the bias signal generator 142 to the ion current collector 224.

As described above, the size of the second aperture may be adjusted by rotating the rotatable gear 136 (see FIG. 2D) to a respective angular position by operating a rotary drive 150 coupled to the rotatable gear 136 by mechanical couplers 152, such as the gear and shaft coupler comprising the gear 250 and a shaft inserted in the passage 236 (see FIGS. 1-2E).

Also, as described above, generating the first voltage comprises sensing a potential of the conductive plate 220, applying that as the reference voltage of the bias signal generator 142, and adjusting a variable voltage source of the bias signal generator 142 to output the first voltage relative to the reference voltage.

When configured for a particular measurement condition and exposed to plasma, the ion current collector 224 collects the arrival rate of ions in the specific range of ion energy and ion angle, specified by a specific pair of values of $E_{min}$ and $A_{max}$, as described above. The response, i.e., the ion current, is transmitted from the second electrode 245 of the detector 132 to the input port of the current sensing circuit 330 in the ion current sense and analysis circuit 144 using electrical couplers (e.g., cables and connectors).

As indicated in blocks 440-450 of the flowchart of the method 400, the data acquired and transmitted to the ion current sense and analysis circuit 144 is then sensed and analyzed to obtain the joint distribution function of ion angle and ion energy of ions in the ion flux to the conductive plate 220 of the detector 132.

As described in box 440, the ion current for each measurement condition is measured by the current sensing circuit 330, and the measurement is tagged and stored in the digital memory 340, as described above with reference to FIG. 3B. The respective pair of values of $E_{min}$ and $A_{max}$ is sent, from the measurement system controller 160, to another input port of the ion current sense and analysis circuit 144 (see FIG. 3B), where the data is received, tagged, and stored in the digital memory 340.

Each configuration of the detector 132 yields an ion current at the ion current collector 224, which is transmitted to the sense and analysis circuit 144. The ion currents are measured and stored for each pair of values of $E_{min}$ and $A_{max}$ in the set of measurement conditions to obtain a set of ion current measurements. While the measurement condition may be changed in any order, the values of $E_{min}$ and $A_{max}$ may be varied systematically. For example, first, the detector 132 may be configured for $A_{max}=0°$ and $E_{min}=0$ eV. Then $E_{min}$ may be increased in a sequence of steps to the upper limit of ion energy, $E_{minUL}$, of the set of measurement conditions. Note that the difference between two successive measurements of ion current divided by the difference in the two respective values of $E_{min}$ yields the IEDF for $A_{max}=0°$. Then $A_{max}$ may be stepped to the next value of $A_{max}$ and the sequence of ion current measurements with increasing $E_{min}$ be repeated to obtain the next IEDF. This process may be continued to obtain a sequence of IEDFs till an IEDF for $A_{max}=A_{maxUL}$ is obtained. Now, the 2D distribution function of ion angle and ion energy is obtained by taking the difference between two successive IEDFs of the sequence of IEDFs and dividing by the difference in the two respective values of $A_{max}$.

The sequence of measurements and calculations described above is equivalent of, first, obtaining the set of ion current measurements for the set of measurement conditions for the plasma process and then taking the partial derivative with respect to $E_{min}$ and $A_{max}$ numerically, using a simple finite difference technique. More complex finite difference methods using different combinations of differences in ion angles may be used to improve the accuracy with which the partial derivative is computed.

Instructions for extracting the joint distribution function of ion angle and ion energy of ions based on the data may be coded in a program and stored in the digital memory 340. Sensing and analyzing the ion currents and measurement conditions comprises storing (in the digital memory 340) the digitized ion currents received from the current sensing circuit 330, storing the respective measurement conditions received from the measurement system controller 160, and, after the data comprising the ion current measurements and the respective measurement conditions have been stored, executing the program stored in the memory 340. The processor 350 may be instructed by the measurement system controller 160 to execute the program to provide the joint distribution function of ion angle and ion energy of ions in the ion flux to the conductive plate 220 of the detector 132.

As explained above, the ion energy distribution function (IEDF) is obtained when the joint distribution function is summed (or integrated) over all possible angles, and the ion angle distribution function (IADF) is obtained when the joint distribution function is summed (or integrated) over all possible ion energies. As known to persons skilled in the art, the spread in ion angle in the IADF is related to ion temperature. Hence, the ion temperature there, denoted by $T_{i,sh}$, may be estimated from the full width at half maximum (FWHM) of the IADF, denoted by, $\theta_{IAD}$. Typically, an ion crossing the edge into the sheath region is swept through the sheath by the high electric field there without colliding with, for example, neutral radicals. Assuming collisionless transit of ions, theoretically, $k_B T_{i,sh} \approx eV_{sh} \tan^2(\theta_{IAD})$, where $V_{sh}$ is the voltage drop in the sheath, $k_B$ is Boltzmann's constant, and e is electronic charge.

We have described embodiments of a plasma measurement system and method to characterize a direct plasma process. The characterization is measuring a joint distribution function of ion angle and ion energy of ions in the ion flux of ions incident on a major surface of the substrate being exposed to the plasma in a plasma chamber. Such data is of importance to various plasma processes, including HARC etch processes, which are known to be very sensitive to the distribution of ions in a narrow range of ion angle and ion energy. The embodiments utilize an iris diaphragm in the ion detector to vary a range of ion angle. Using the iris diaphragm to vary an aperture size to vary the ion angle range of ions measured by the ion current measurement provides several advantages. One advantage provided is improvement in the precision and resolution with which the ion angle may be varied relative to alternative detector designs, for example, a detector where the angle is varied by having an angle selection grid comprising a grid with grid openings drilled at various angles. Another advantage is reduction in manufacturing complexity, hence reduction in the cost of detectors. For example, the iris diaphragm eliminates the complexity of electrically accessing multiple ion current collectors in detectors where many collectors are placed in one detector to measure ion current at various ion angles. The invention also reduces the complexity of operation experienced in measurement systems where the angle is varied by other methods. For example, in one method, the detector (or an angle selector within the detector) is changed to change the ion angle. In another method that is complex to perform, the detector is mounted on a special rotatable holder and rotated in the plasma chamber to vary the ion angle during the measurement. The simplifications provided by the embodiments described above reduces the measurement cost.

Example embodiments of the invention are described below. Other embodiments can also be understood from the entirety of the specification as well as the claims filed herein.

Example 1. A detector for a plasma measurement system, where the detector includes an insulating substrate including a cavity; a conductive plate spanning an entrance to the cavity; a first aperture through the conductive plate; an iris diaphragm including movable blades around a second aperture, the second aperture being aligned to the first aperture; an ion current collector disposed in the cavity, the iris diaphragm being disposed between the ion current collector and the conductive plate; and a rotatable gear coupled to the movable blades of the iris diaphragm.

Example 2. The detector of example 1, where the first aperture has a fixed first size; where the second aperture has an adjustable second size; where the adjustable second size is greater than or equal to the first size; where the adjustable second size is adjusted in discrete steps, each discrete step being equal to or greater than the first size; and where the rotatable gear is configured to be rotated during operation to move the movable blades to adjust the adjustable second size.

Example 3. The detector of one of examples 1 or 2, further including: a first electrode coupled to the conductive plate by a first conductive channel disposed in the insulating substrate coupling the first electrode to a first contact coupled to the conductive plate; and a second electrode coupled to the ion current collector by a second conductive channel disposed in the insulating substrate coupling the second electrode to a second contact coupled to the ion current collector.

Example 4. The detector of one of examples 1 to 3, further including: insulating rings configured to electrically insulate the conductive plate, the iris diaphragm, and the ion current collector.

Example 5. The detector of one of examples 1 to 4, further including: a first conductive grid disposed between the conductive plate and the iris diaphragm; and a second conductive grid disposed between the first conductive grid and the iris diaphragm.

Example 6. The detector of one of examples 1 to 5, further including: a third electrode electrically coupled to the first conductive grid by a third conductive channel disposed in the insulating substrate coupling the third electrode to a third contact coupled to the first conductive grid; and a fourth electrode electrically coupled to the second conductive grid by a fourth conductive channel disposed in the insulating substrate coupling the fourth electrode to a fourth contact coupled to the second conductive grid.

Example 7. The detector of one of examples 1 to 6, further including: insulating rings configured to block electrical coupling between the first conductive grid, the second conductive grid, the conductive plate, the iris diaphragm, and the ion current collector.

Example 8. The detector of one of examples 1 to 7, further including: a plurality of fasteners positioned in a plurality of fastener holes extending through the insulating substrate outside the cavity, the plurality of fasteners and fastener holes configured to secure an aligned structure including the iris diaphragm and the conductive plate.

Example 9. A plasma measurement system for a plasma processing system, where the plasma measurement system includes a detector including: a conductive plate spanning an entrance to a cavity in an insulating substrate, the conductive plate including a first aperture; an iris diaphragm configured to have a variable second aperture, the second aperture aligned to the first aperture; an ion current collector disposed in the cavity, the iris diaphragm disposed between the ion current collector and conductive plate; and a rotatable gear coupled to the iris diaphragm and configured to vary a dimension of the second aperture; electrical equipment configured to be coupled to the detector, the equipment including: a bias signal generator configured to bias the ion current collector; and an ion current sense and analysis circuit configured to provide a signal representative of a joint distribution function of angle and energy of ions based on ion currents from the ion current collector, and a rotary drive mechanically coupled to the rotatable gear; and a controller configured to send signals including measurement conditions to the rotary drive and the electrical equipment.

Example 10. The plasma measurement system of example 9, where the detector further includes: a first conductive grid disposed between the conductive plate and the iris diaphragm; and a second conductive grid disposed between the first conductive grid and the iris diaphragm.

Example 11. The plasma measurement system of one of examples 9 or 10, where the bias signal generator includes: a voltage sensor circuit configured to sense a potential of the conductive plate and apply the sensed potential as a reference voltage of the bias signal generator, and a variable voltage source configured to provide a first voltage relative to the reference voltage, where, during operation, the first voltage is coupled to the ion current collector.

Example 12. The plasma measurement system of one of examples 9 to 11, where the ion current sense and analysis circuit includes: a current sensing circuit configured to provide a digital signal representative of an ion current received from the ion current collector; a digital memory configured to store data and a program, the program including instructions to compute a joint distribution function of angle and energy of ions based on the stored data, the data including measurements received from the current sensing circuit and respective measurement conditions received from the controller; and a processor configured to execute the program.

Example 13. The plasma measurement system of one of examples 9 to 12, where the rotary drive includes an electromechanical rotary device.

Example 14. The plasma measurement system of one of examples 9 to 13, where the rotary drive includes a servo motor.

Example 15. The plasma measurement system of one of examples 9 to 14, further including: connectors to couple the detector positioned inside a plasma chamber to the electrical equipment and the rotary drive disposed outside the plasma chamber via vacuum feedthroughs of the plasma chamber.

Example 16. A method of measuring a plasma in a plasma chamber of a plasma processing system, where the method includes positioning a detector over a substrate holder in the plasma chamber; generating the plasma directly above the detector in the plasma chamber; configuring the detector sequentially through a set of measurement conditions, the configuring including changing, for each set of the measurement conditions, an aperture of an iris diaphragm in the detector; sensing an ion current at an ion current collector aligned to the iris diaphragm in the detector for each set of the measurement conditions; and based on the sensed ion currents and measurement conditions, determining a joint distribution function of angle and energy of ions in an ion flux from the plasma.

Example 17. The method of example 16, where generating the plasma includes: flowing a discharge gas at low pressure through the plasma chamber; and powering electrodes coupled to the plasma chamber, the powering ionizing the discharge gas to ignite and sustain the plasma in the plasma chamber.

Example 18. The method of one of examples 16 or 17, where changing the aperture includes rotating a rotatable gear coupled to the iris diaphragm by operating a rotary drive coupled to the rotatable gear; and where configuring the detector for each set of the measurement conditions further includes coupling a first voltage to the ion current collector, the coupling including: sensing a potential of a conductive plate of the detector, the conductive plate spanning an entrance to the detector, applying the sensed potential as a reference voltage of a bias signal generator; and adjusting a variable voltage source of the bias signal generator to output the first voltage relative to the reference voltage.

Example 19. The method of one of examples 16 to 18, where, for each measurement condition, configuring the detector further includes: coupling a second voltage provided by the bias signal generator to a first conductive grid disposed between the conductive plate and the iris diaphragm; and coupling a third voltage provided by the bias signal generator to a second conductive grid disposed between the first conductive grid and the iris diaphragm.

Example 20. The method of one of examples 16 to 19, where sensing the ion current includes: coupling a current sensing circuit to the ion current collector, the current sensing circuit providing a signal representative of each ion current received from the ion current collector.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A detector for a plasma measurement system, the detector comprising:
    an insulating substrate comprising a cavity;
    a conductive plate spanning an entrance to the cavity;
    a first aperture through the conductive plate;
    an iris diaphragm comprising movable blades around a second aperture, the second aperture being aligned to the first aperture;
    an ion current collector disposed in the cavity, the iris diaphragm being disposed between the ion current collector and the conductive plate; and
    a rotatable gear coupled to the movable blades of the iris diaphragm.

2. The detector of claim 1,
    wherein the first aperture has a fixed first size;
    wherein the second aperture has an adjustable second size;
    wherein the adjustable second size is greater than or equal to the first size;
    wherein the adjustable second size is adjusted in discrete steps, each discrete step being equal to or greater than the first size; and
    wherein the rotatable gear is configured to be rotated during operation to move the movable blades to adjust the adjustable second size.

3. The detector of claim 1, further comprising:
    a first electrode coupled to the conductive plate by a first conductive channel disposed in the insulating substrate coupling the first electrode to a first contact coupled to the conductive plate; and
    a second electrode coupled to the ion current collector by a second conductive channel disposed in the insulating substrate coupling the second electrode to a second contact coupled to the ion current collector.

4. The detector of claim 1, further comprising:
    insulating rings configured to electrically insulate the conductive plate, the iris diaphragm, and the ion current collector.

5. The detector of claim 1, further comprising:
    a first conductive grid disposed between the conductive plate and the iris diaphragm; and
    a second conductive grid disposed between the first conductive grid and the iris diaphragm.

6. The detector of claim 5, further comprising:
    a third electrode electrically coupled to the first conductive grid by a third conductive channel disposed in the insulating substrate coupling the third electrode to a third contact coupled to the first conductive grid; and
    a fourth electrode electrically coupled to the second conductive grid by a fourth conductive channel disposed in the insulating substrate coupling the fourth electrode to a fourth contact coupled to the second conductive grid.

7. The detector of claim 5, further comprising:
    insulating rings configured to block electrical coupling between the first conductive grid, the second conductive grid, the conductive plate, the iris diaphragm, and the ion current collector.

8. The detector of claim 1, further comprising:
    a plurality of fasteners positioned in a plurality of fastener holes extending through the insulating substrate outside the cavity, the plurality of fasteners and fastener holes configured to secure an aligned structure comprising the iris diaphragm and the conductive plate.

9. A plasma measurement system for a plasma processing system, the plasma measurement system comprising:
    a detector comprising:
        a conductive plate spanning an entrance to a cavity in an insulating substrate, the conductive plate comprising a first aperture;
        an iris diaphragm configured to have a variable second aperture, the second aperture aligned to the first aperture;
        an ion current collector disposed in the cavity, the iris diaphragm disposed between the ion current collector and the conductive plate; and
        a rotatable gear coupled to the iris diaphragm and configured to vary a dimension of the second aperture;
    electrical equipment configured to be coupled to the detector, the equipment comprising:
        a bias signal generator configured to bias the ion current collector; and
        an ion current sense and analysis circuit configured to provide a signal representative of a joint distribution function of angle and energy of ions based on ion currents from the ion current collector, and
    a rotary drive mechanically coupled to the rotatable gear; and
    a controller configured to send signals comprising measurement conditions to the rotary drive and the electrical equipment.

10. The plasma measurement system of claim 9, wherein the detector further comprises:
    a first conductive grid disposed between the conductive plate and the iris diaphragm; and
    a second conductive grid disposed between the first conductive grid and the iris diaphragm.

11. The plasma measurement system of claim 9, wherein the bias signal generator comprises:
- a voltage sensor circuit configured to sense a potential of the conductive plate and apply the sensed potential as a reference voltage of the bias signal generator, and
- a variable voltage source configured to provide a first voltage relative to the reference voltage, wherein, during operation, the first voltage is coupled to the ion current collector.

12. The plasma measurement system of claim 9, wherein the ion current sense and analysis circuit comprises:
- a current sensing circuit configured to provide a digital signal representative of an ion current received from the ion current collector;
- a digital memory configured to store data and a program, the program comprising instructions to compute a joint distribution function of angle and energy of ions based on the stored data, the data comprising measurements received from the current sensing circuit and respective measurement conditions received from the controller; and
- a processor configured to execute the program.

13. The plasma measurement system of claim 9, wherein the rotary drive comprises an electromechanical rotary device.

14. The plasma measurement system of claim 9, wherein the rotary drive comprises a servo motor.

15. The plasma measurement system of claim 9, further comprising: connectors to couple the detector positioned inside a plasma chamber to the electrical equipment and the rotary drive disposed outside the plasma chamber via vacuum feedthroughs of the plasma chamber.

16. A method of measuring a plasma in a plasma chamber of a plasma processing system, the method comprising:
- positioning a detector over a substrate holder in the plasma chamber;
- generating the plasma directly above the detector in the plasma chamber;
- configuring the detector sequentially through a set of measurement conditions, the configuring comprising changing, for each set of the measurement conditions, an aperture of an iris diaphragm in the detector;
- sensing an ion current at an ion current collector aligned to the iris diaphragm in the detector for each set of the measurement conditions; and
- based on the sensed ion currents and measurement conditions, determining a joint distribution function of angle and energy of ions in an ion flux from the plasma.

17. The method of claim 16, wherein generating the plasma comprises:
- flowing a discharge gas at low pressure through the plasma chamber; and
- powering electrodes coupled to the plasma chamber, the powering ionizing the discharge gas to ignite and sustain the plasma in the plasma chamber.

18. The method of claim 16,
- wherein changing the aperture comprises rotating a rotatable gear coupled to the iris diaphragm by operating a rotary drive coupled to the rotatable gear; and
- wherein configuring the detector for each set of the measurement conditions further comprises coupling a first voltage to the ion current collector, the coupling comprising:
  - sensing a potential of a conductive plate of the detector, the conductive plate spanning an entrance to the detector,
  - applying the sensed potential as a reference voltage of a bias signal generator; and
  - adjusting a variable voltage source of the bias signal generator to output the first voltage relative to the reference voltage.

19. The method of claim 18, wherein, for each measurement condition, configuring the detector further comprises:
- coupling a second voltage provided by the bias signal generator to a first conductive grid disposed between the conductive plate and the iris diaphragm; and
- coupling a third voltage provided by the bias signal generator to a second conductive grid disposed between the first conductive grid and the iris diaphragm.

20. The method of claim 16, wherein sensing the ion current comprises:
- coupling a current sensing circuit to the ion current collector, the current sensing circuit providing a signal representative of each ion current received from the ion current collector.

* * * * *